US008754652B2

(12) United States Patent
Mayer et al.

(10) Patent No.: US 8,754,652 B2

(45) Date of Patent: Jun. 17, 2014

(54) METHOD FOR ASCERTAINING A TYPE OF A GAS DISCHARGE LAMP AND ELECTRONIC BALLAST FOR OPERATING AT LEAST TWO DIFFERENT TYPES OF GAS DISCHARGE LAMPS

(75) Inventors: Siegfried Mayer, Moosinning (DE); Christof Schwarzfischer, Oberfischbach (DE)

(73) Assignee: Osram Gesellschaft mit Beschraenkter Haftung, Munich (DE)

( * ) Notice: Subject to any disclaimer, the term of this patent is extended or adjusted under 35 U.S.C. 154(b) by 461 days.

(21) Appl. No.: 12/769,664

(22) Filed: Apr. 29, 2010

(65) Prior Publication Data

US 2010/0277178 A1 Nov. 4, 2010

(30) Foreign Application Priority Data

Apr. 30, 2009 (DE) ........................ 10 2009 019 625

(51) Int. Cl.

*G01R 31/00* (2006.01)
*H05B 39/00* (2006.01)
*H05B 41/14* (2006.01)
*H05B 37/02* (2006.01)

(52) U.S. Cl.

USPC ............. 324/414; 324/403; 324/409; 315/95; 315/96; 315/224

(58) Field of Classification Search

USPC ........................................................ 324/414

See application file for complete search history.

(56) References Cited

U.S. PATENT DOCUMENTS

| | | | | |
|---|---|---|---|---|
| 4,503,361 | A * | 3/1985 | Hanlet | 315/221 |
| 4,730,163 | A * | 3/1988 | Santos | 324/414 |
| 4,792,727 | A * | 12/1988 | Godyak | 315/176 |
| 4,937,501 | A * | 6/1990 | Ganser et al. | 315/209 R |
| 4,989,127 | A * | 1/1991 | Wegener | 363/16 |
| 4,994,716 | A * | 2/1991 | Ganser et al. | 315/200 R |
| 5,039,921 | A * | 8/1991 | Kakitani | 315/307 |
| 5,130,611 | A * | 7/1992 | Johns | 315/224 |

(Continued)

FOREIGN PATENT DOCUMENTS

| | | |
|---|---|---|
| CN | 101166391 A | 4/2008 |
| DE | 10345610 A1 | 5/2005 |

OTHER PUBLICATIONS

Chinese Office Action for corresponding foreign application; dated Oct. 18, 2013.

*Primary Examiner* — Jermele M Hollington
*Assistant Examiner* — Christopher McAndrew

(57) ABSTRACT

Various embodiments provide a method for ascertaining a type of a gas discharge lamp using an electronic ballast for operating different types of gas discharge lamps, wherein the different types of gas discharge lamps differ in at least one operating parameter, wherein the method may include: a) preheating at least one filament in the gas discharge lamp for a predetermined preheating time; b) measuring a physical variable which is characteristic for the type of the gas discharge lamp at the end of the preheating time and providing the measurement value of said variable; and c) ascertaining the lamp type on the basis of the measurement value which is provided, wherein the preheating time is increased by a predetermined time period and the b) and c) are repeated if the lamp type in c) cannot be ascertained uniquely. Moreover, various embodiments provide an electronic ballast for operating at least two different types of gas discharge lamps which have at least one different operating parameter.

14 Claims, 3 Drawing Sheets

(56) References Cited

U.S. PATENT DOCUMENTS

| | | | | | |
|---|---|---|---|---|---|
| 5,148,087 | A * | 9/1992 | Moisin et al. | 315/291 |
| 5,394,062 | A * | 2/1995 | Minarczyk et al. | 315/129 |
| 5,424,611 | A * | 6/1995 | Moriarty, Jr. | 315/94 |
| 5,489,823 | A * | 2/1996 | Nilssen | 315/227 R |
| 5,569,984 | A * | 10/1996 | Holtslag | 315/307 |
| 5,652,480 | A * | 7/1997 | Groiss | 315/247 |
| 5,656,891 | A * | 8/1997 | Luger et al. | 315/94 |
| 5,801,492 | A * | 9/1998 | Bobel | 315/244 |
| 5,804,926 | A * | 9/1998 | Deavenport | 310/219 |
| 5,828,187 | A * | 10/1998 | Fischer | 315/291 |
| 5,841,241 | A * | 11/1998 | Nilssen | 315/244 |
| 5,859,504 | A * | 1/1999 | Nerone | 315/307 |
| 5,952,794 | A * | 9/1999 | Bergman et al. | 315/307 |
| 5,959,408 | A * | 9/1999 | Steel et al. | 315/106 |
| 6,160,361 | A * | 12/2000 | Giannopoulos et al. | 315/307 |
| 6,169,375 | B1 * | 1/2001 | Moisin | 315/291 |
| 6,300,719 | B1 * | 10/2001 | Tlaga et al. | 315/94 |
| 6,316,886 | B1 * | 11/2001 | Luger et al. | 315/307 |
| 6,359,387 | B1 * | 3/2002 | Giannopoulos et al. | 315/46 |
| 6,414,448 | B1 * | 7/2002 | Noone et al. | 315/291 |
| 6,577,078 | B2 * | 6/2003 | Shen | 315/307 |
| 6,657,403 | B2 * | 12/2003 | Schemmel et al. | 315/291 |
| 6,731,075 | B2 * | 5/2004 | Pak | 315/274 |
| 6,806,649 | B2 * | 10/2004 | Mollema et al. | 315/96 |
| 6,825,620 | B2 * | 11/2004 | Kuennen et al. | 315/224 |
| 6,864,685 | B2 * | 3/2005 | Otsuka et al. | 324/410 |
| 6,930,454 | B2 * | 8/2005 | Lott | 315/308 |
| 6,972,531 | B2 | 12/2005 | Krummel | |
| 6,972,570 | B2 * | 12/2005 | Schriefer | 324/414 |
| 7,030,568 | B2 * | 4/2006 | Boke et al. | 315/224 |
| 7,064,499 | B2 * | 6/2006 | Lott | 315/291 |
| 7,109,668 | B2 * | 9/2006 | Pogodayev et al. | 315/307 |
| 7,145,342 | B2 * | 12/2006 | Wendt et al. | 324/414 |
| 7,183,714 | B1 * | 2/2007 | Choudhury | 315/97 |
| 7,199,528 | B2 * | 4/2007 | Quazi | 315/247 |
| 7,560,867 | B2 | 7/2009 | Schwannecke et al. | |
| 7,589,472 | B2 * | 9/2009 | Keith et al. | 315/94 |
| 7,812,612 | B2 * | 10/2010 | Feldtkeller et al. | 324/414 |
| 8,148,920 | B2 | 4/2012 | Lee et al. | |
| 2008/0218171 | A1 * | 9/2008 | Keith et al. | 324/414 |

* cited by examiner

METHOD FOR ASCERTAINING A TYPE OF A GAS DISCHARGE LAMP AND ELECTRONIC BALLAST FOR OPERATING AT LEAST TWO DIFFERENT TYPES OF GAS DISCHARGE LAMPS

CROSS-REFERENCE TO RELATED APPLICATION

This application claims priority to German Patent Application Serial No. 10 2009 019 625.0, which was filed Apr. 30, 2009, and is incorporated herein by reference in its entirety.

TECHNICAL FIELD

Various embodiments generally relate to a method for ascertaining a type of a gas discharge lamp and an electronic ballast for operating at least two different types of gas discharge lamps.

BACKGROUND

Conventional electronic ballasts are suitable for the operation of different types of gas discharge lamps, e.g. for the operation of different types of low-pressure discharge lamps. Units of this type are referred to as multilamp units or as intelligent electronic ballasts. In a multilamp unit, the operating parameters for those types of lamps are stored which can be operated by this unit. For example, different types of lamps differ in the lamp current necessary for their operation. The unit selects the operating parameters to be used as a function of the type of the connected lamp. To this end it needs to identify the lamp type beforehand.

Some of the conventional units identify the lamp type by evaluating the cold resistance of a filament in the lamp at every start. If gas discharge lamps are used, in which the lamp filaments are preheated, the warm resistance of a lamp filament at the end of the preheating phase can also be evaluated. However, it is possible for identification errors to occur. If the lamp type is changed, the preheating parameter set which is still present from the previous lamp is used for the newly connected lamp, with the result that it is not preheated in an optimum fashion. As a result the ascertained value for the warm resistance of the filament can be in a region which cannot be assigned uniquely to a lamp type. Identification errors may result. However, if a lamp is operated using the wrong parameter values, it may not ignite properly or the service life of the lamp is reduced.

SUMMARY OF THE INVENTION

Various embodiments provide a method for ascertaining a type of a gas discharge lamp using an electronic ballast for operating different types of gas discharge lamps, wherein the different types of gas discharge lamps differ in at least one operating parameter, wherein the method may include: a) preheating at least one filament in the gas discharge lamp for a predetermined preheating time; b) measuring a physical variable which is characteristic for the type of the gas discharge lamp at the end of the preheating time and providing the measurement value of said variable; and c) ascertaining the lamp type on the basis of the measurement value which is provided, wherein the preheating time is increased by a predetermined time period and the b) and c) are repeated if the lamp type in c) cannot be ascertained uniquely. Moreover, various embodiments provide an electronic ballast for operating at least two different types of gas discharge lamps which have at least one different operating parameter.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word “exemplary” is used herein to mean “serving as an example, instance, or illustration”. Any embodiment or design described herein as “exemplary” is not necessarily to be construed as preferred or advantageous over other embodiments or designs.

Various embodiments provide a method for ascertaining a type of a gas discharge lamp using an electronic ballast for operating different types of gas discharge lamps, wherein the different types of gas discharge lamps differ in at least one operating parameter, wherein the method may include: preheating at least one filament in the gas discharge lamp for a predetermined preheating time, measuring a physical variable which is characteristic of the type of the gas discharge lamp at the end of the preheating time and providing the measurement value of said variable, and ascertaining the lamp type on the basis of the measurement value which is provided. Various embodiments moreover provide a corresponding electronic ballast for operating at least two different types of gas discharge lamps.

Various embodiments develop a method as set out in the introduction and of an electronic ballast as set out in the introduction such that identification errors of the lamp type are avoided.

Various embodiments are based on the finding that this effect can be achieved if the duration of the preheating is increased. To this end, the preheating time, if the lamp type cannot be ascertained uniquely in the first step, is increased by a predetermined time period and at the end of the increased preheating time the lamp type is ascertained again. It has been found that in this case the ascertained value for the warm resistance of the lamp filament can be assigned uniquely to a lamp type if the preheating time is selected to be sufficiently long. However, the manufacturers of electronic ballasts for gas discharge lamps wish to keep the preheating time as short as possible in order to avoid there being a gap between switching on and ignition of the lamp which can be noticed by the user. This conflict of interests is solved according to various embodiments in that first a preheating time which is customary for preheating the set lamp type and is e.g. less than or equal to one second is selected, and in that the preheating time is increased only in those cases in which no unique identification is possible.

Figure 1:
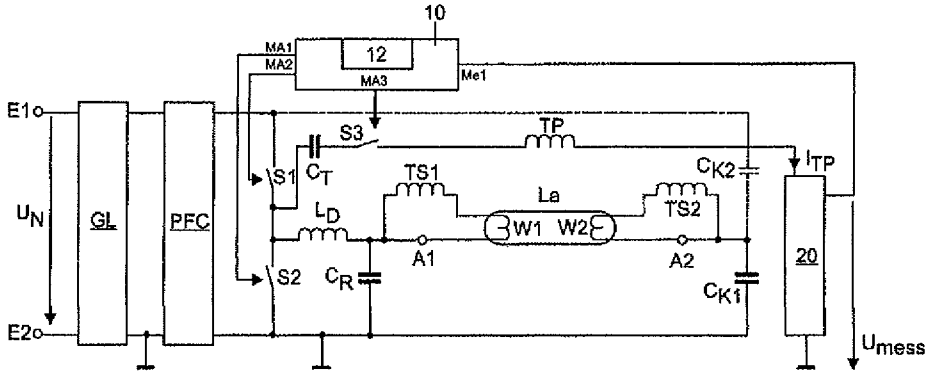
FIG. 1 shows a schematic representation of an embodiment of an electronic ballast.

FIG. 1 shows a schematic representation of an embodiment of an electronic ballast. The latter includes an input having a first input terminal E1 and a second input terminal E2, between which a mains voltage $U_N$ is applied. A rectifier GL, adapted to rectify the mains voltage $U_N$, is connected downstream of inputs E1 and E2. Provided downstream of the rectifier GL is a power factor correction circuit (PFC) which increases the rectified voltage to a constant value and ensures a sinusoidal mains power consumption. A half-bridge circuit with a first half-bridge switch S1 and a second half-bridge switch S2 is coupled between the output terminals of the power factor correction circuit PFC. Connected to the output of the half-bridge circuit, that is to say between the switches S1 and S2, is a load circuit which contains a gas discharge lamp La to be operated using the electronic ballast. The load circuit includes a series resonant circuit, which is made up of an inductance coil $L_D$ and a resonant capacitor $C_R$ which is coupled between a first output terminal A1 and ground. A gas discharge lamp La which is to be operated using the electronic ballast is coupled between the first output terminal A1 and a second output terminal A2 of the electronic ballast. The embodiment shown in FIG. 1 represents an electronic ballast for operating a gas discharge lamp. The principle of various embodiments, however, can likewise be applied to ballasts which can be used to operate more than one lamp at the same time. The second output terminal A2 is likewise coupled to ground via a coupling capacitor $C_{K1}$. A second coupling capacitor $C_{K2}$ can optionally be provided between the terminal of switch S1, which terminal is at high potential, and the second output terminal A2, which is indicated in the figure by dashed lines.

Various embodiments provide a preheating device of the electronic ballast, which preheating device is used to preheat at least one and preferably both filaments W1 and W2 of the gas discharge lamp La. Owing to the preheating of the lamp filaments before ignition of the lamp, a more gentle lamp start, and thus a longer service life of the lamp, is achieved. The preheating device has, for this purpose, a heat transformer with a primary winding TP and two secondary windings TS1 and TS2. The primary winding TR is connected to the output of the half bridge between the two switches S1 and S2 via a switch S3 and a trapezoidal capacitor $C_T$. The first secondary winding TS1 is coupled to the first lamp filament W1, while the second secondary winding TS2 is coupled to the second lamp filament W2. The other end of the primary winding TP is connected to a measurement circuit 20 in order to detect a current $I_{TP}$ which flows through the primary winding TP and which is proportional to the currents which flow through the secondary windings and thus through the lamp filaments. The measurement circuit 20 contains a shunt resistor and provides at its output a voltage $U_{mess}$ which is derived therefrom. Said voltage $U_{mess}$ is supplied to an input ME1 of a microcontroller 10. The microcontroller 10 has, in addition, outputs MA1, MA2 and MA3, via which it drives the switches S1 and S2 of the half bridge and the switch S3, via which the heating device is coupled to the half bridge. FIG. 1 also shows a memory 12 of the microcontroller 10 for storing data necessary for operating the gas discharge lamp La. In various embodiments, the memory 12 may be part of the microcontroller 10. It is also possible for a plurality of memories to be provided rather than one memory, which could also be arranged outside the microcontroller.

If a plurality of lamps of the same type are intended to be operated using the electronic ballast, the heating transformer includes, in the case of a unit adapted for operating two lamps, four rather than two secondary windings. In the case of units adapted for operating more than two lamps, one heating transformer with in each case one primary winding and one secondary winding for each filament to be heated is present for in each case two lamps, wherein the primary windings of the heating transformers are connected in parallel.

The mode of operation of the electronic ballast is intended to be described below, in as far as it relates to the identification of the type of the connected gas discharge lamp La. The electronic ballast according to various embodiments is a multilamp unit which is adapted for operating different types of gas discharge lamps, wherein the gas discharge lamps differ by at least one operating parameter. The gas discharge lamps are, by way of example, low-pressure gas discharge lamps which differ by the lamp current which is necessary for their operation. The electronic ballast according to various embodiments can be used to differentiate in particular three types of lamps. These different lamp types have different filaments which differ in their electric resistances. In order to be able to operate different lamps using one unit, an assignment between the individual lamp types and the operating parameters necessary for their operation is stored in the memory 12. Operating parameters are, inter alia, the lamp current which flows through the lamp after its ignition, and the preheating time for which the lamp filaments W1 and W2 are preheated before ignition of the lamp by closing the switch S3 and inducing a current flow through the filaments W1 and W2 via the heating transformer. The preheating time which is optimum for a lamp likewise depends on the lamp type, the aim being to keep this time as short as possible. A preheating time of at most 1 s is currently tolerated. Since the filaments of the different lamp types differ in their electric resistance, a variable which is related to the electric resistance of the filaments is measured. By way of example, the voltage $U_{mess}$, which is derived from the shunt resistor of the measurement circuit 20, which shunt resistor is series-connected to the primary winding TP of the heating transformer, is measured in this respect at the end of the preheating time. The lamp type is ascertained in this case on the basis of expectation values for the warm resistance of a filament which was heated using the correct operating parameters. However, if, after a lamp exchange, a lamp of another type than before is connected, the new lamp is not operated using the parameters which are optimum for it. According to various embodiments, different tables of values are therefore used to ascertain the lamp type from the measured voltage $U_{mess}$ for different preheating parameters, which tables of values indicate an assignment between the lamp type and the voltage $U_{mess}$ which is measured at the end of the preheating phase as a function of the preheating parameters used. These tables of values are likewise stored in the memory 12 or in a dedicated memory.

Figure 2:
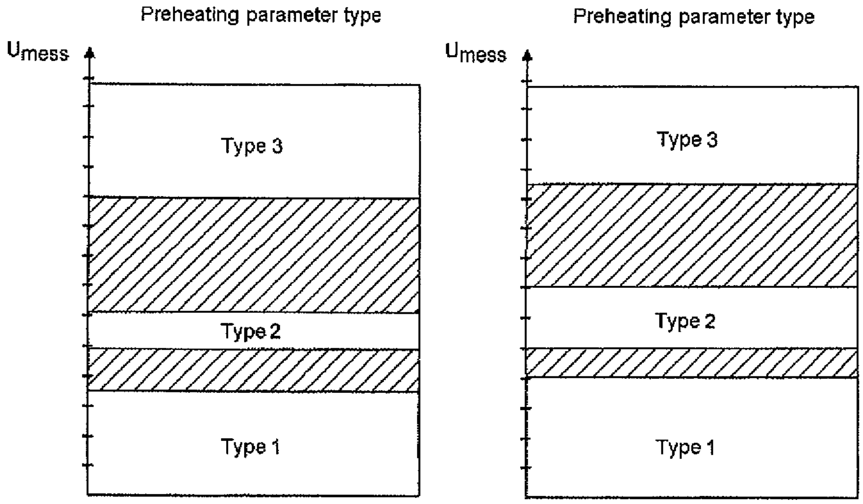
FIG. 2 shows a schematic representation of tables of values for different preheating parameters.

FIG. 2 shows, by way of example, two such tables of values. For the left-hand table of values, all three lamp types were heated with the preheating parameters for type 1 and at the end of the preheating time the voltage $U_{mess}$, plotted on the vertical axis, was measured. For each lamp type, this results in one region of values in which the measured voltage $U_{mess}$ can be assigned uniquely to a lamp type. Located in-between are the hatched regions in which no unique assignment is possible. For the right-hand table of values, all three lamp types were heated with the preheating parameters for type 2. When compared to the left-hand table, there is a slight upward offset of the regions of values. However, even if tables of values which are matched to the preheating parameters are used, it is possible that a measurement value of the voltage $U_{mess}$ falls within the hatched region in which no unique assignment to a lamp type is possible. The reason for this is that the heating behavior and the filament resistance also change with the age of a lamp or the lamp which is used, or its filaments, lies outside the permitted manufacturing tolerances.

Figure 3:
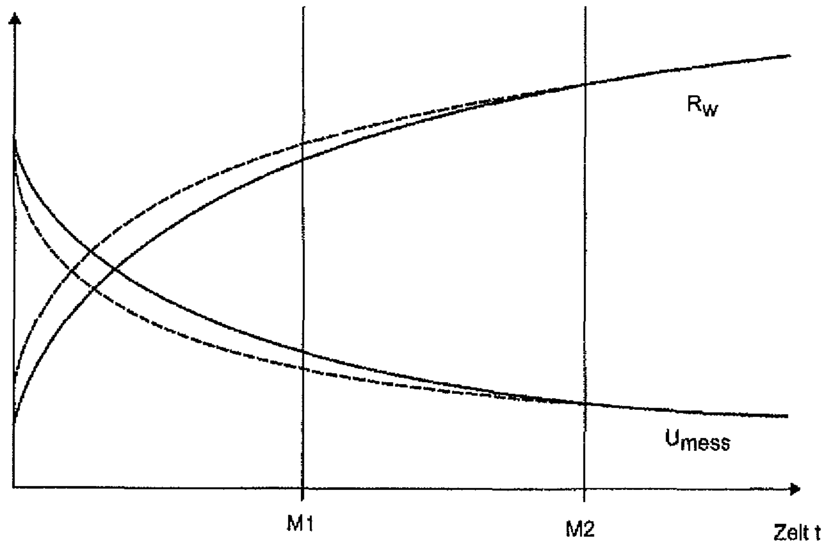
FIG. 3 shows the warm resistance $R_W$ of a filament and an associated measured voltage $U_{mess}$ as a function of the preheating time.

FIG. 3 shows the dependence of the heat resistance $R_W$ and of the measured voltage $U_{mess}$ on the preheating time. As the FIG. 3 shows, the warm resistance $R_W$ first rises sharply and then gradually levels and finally approaches a limit value. Since the preheating time is meant to be as short as possible, the preheating time M1, which is assigned to a lamp type and is preferably about 0.9 s, is located in the rising region of the curve $R_W$. With increasing age of the filament, the rise of the curve becomes steeper, which is indicated in the figure by the dashed line. The curve for the measured voltage $U_{mess}$ behaves accordingly and drops more steeply with increasing age. This causes a deviation of the value measured at time M1 from the predetermined value for a new lamp and can lead to identification errors of the lamp type. In the method according to various embodiments, if in the first measurement the value of the measured voltage $U_{mess}$ falls within a hatched region of the table of values, the preheating time is therefore increased to the value M2 and at the end of the increased preheating time M2 another measurement of the voltage $U_{mess}$ is carried out. The increased preheating time M2 is selected here such that the curves $R_W$ and $U_{mess}$ there approach their stationary region in which the age of the filament no longer has such a strong influence. This enables a reliable lamp identification. The increased preheating time M2, which can be selected to be the same for all lamp types to be operated using the electronic ballast, is more than 1 s. This is acceptable, however, since it is used only in those cases in which the lamp could not be uniquely identified after the preheating time M1.

Figure 4:
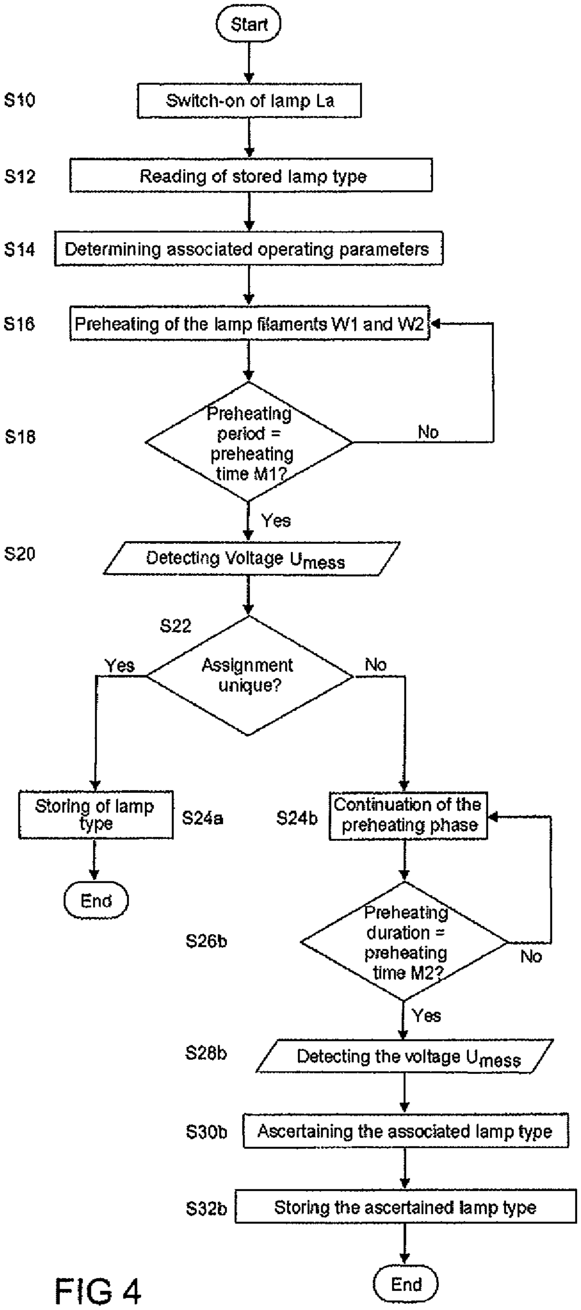
FIG. 4 shows a flow chart of a method according to an embodiment for ascertaining a lamp type.

FIG. 4 shows a flow chart of an embodiment of the method. In S10, the electronic ballast may be switched on by a user. After it is switched on, the stored lamp type may be read out by the microcontroller 10 in S12. For initial operation of the electronic ballast, a default lamp type is stored. In the next step S14, the operating parameters are determined as a function of the lamp type on the basis of the stored assignment of the operating parameters to a lamp type. By way of example, the lamp type acts as an indicator which indicates a set of operating parameters. Subsequently, in step S16, the filaments W1 and W2 of the lamp La are preheated by the microcontroller 10 causing the switch S3 to close. During preheating, a check is carried out in a step S18 as to whether the preheating time M1 provided for the lamp type has expired. As soon as this is the case, the voltage $U_{mess}$ present at the input ME1 of the microcontroller 10 is detected in a step S20. In a step S22, the detected voltage $U_{mess}$ is compared with the table of values which applies to the preheating parameters of the lamp type and a check is carried out as to whether the value of the voltage $U_{mess}$ can be uniquely assigned to a lamp type. If this is the case, the ascertained lamp type is stored in a step S24*a* and the method is finished. If at the end of the preheating time M1 no unique assignment of the detected voltage $U_{mess}$ to t a lamp type is possible yet, the preheating phase is continued in a step S24*b*. During the continuation of the preheating phase, a check is carried out in a step S26*b* as to whether the increased preheating time M2 has expired. If this is the case, in a step S28*b*, the voltage $U_{mess}$ present at the input ME1 of the microcontroller 10 is detected again and, in a step S30*b*, the associated lamp type is ascertained using the table of values which applies to the preheating parameters used. In a step S32*b*, the ascertained lamp type is stored, with which the method is finished. Rather than always storing the ascertained lamp type in the steps S24*a* and S32*b*, it is also possible to check beforehand whether the ascertained lamp type matches the lamp type already stored. The lamp type only needs to be stored again if this is not the case.

In various embodiments, the method may further include the step of storing the lamp type which has been ascertained. The method may include in addition the steps, which are to be carried out at the beginning of the method, of reading the stored lamp type and of determining the predetermined preheating time as a function of the read lamp type on the basis of an assignment, stored in the electronic ballast, between types of gas discharge lamps which are to be operated using the electronic ballast and associated operating parameters. For first operating, a default lamp type may be stored which is used as a basis for determining the operating parameters to be used for first preheating. The ascertained lamp type only needs to be stored if it differs from the already stored lamp type.

In various embodiments, rather than storing the lamp type which has been ascertained, a determination of operating parameters which are assigned to the lamp type which has been ascertained is made on the basis of an assignment, stored in the electronic ballast, between types of gas discharge lamps to be operated using the electronic ballast, and associated operating parameters and the determined operating parameters are provided for use for the next preheating.

The value of a variable which is related to the electrical resistance of the preheated filament may be measured as the physical variable which is characteristic of the type of the gas discharge lamp.

Furthermore, the duration of the increased preheating time may be selected such that the measurement value which is provided lies in a nearly stationary region. The warm resistance of the filament increases with the preheating time and asymptotically approaches a limit value. In this case, in various embodiments, the curve behavior in the steeply increasing region may depend on the age of the filament, while the influence of the age of the filament in the stationary region of the curve is negligible. It is possible in this manner in the stationary region of the curve to identify particularly reliably from the electric resistance the type of the filament and thus the type of the lamp.

In various embodiments, the lamp type may be ascertained on the basis of the measurement value which is provided by comparing the measurement value which is provided with a table of values, then it is checked whether the measurement value which is provided falls into a region of the table of values which can be assigned uniquely to a lamp type, and finally, if the measurement value which is provided can be assigned uniquely to a lamp type, this lamp type is selected as the lamp type which is ascertained. Different tables of values are preferably used in this case for different operating parameters used during preheating of the at least one filament. This is another contributing factor in increasing the reliability of the lamp identification.

The embodiments mentioned in connection with the method according to various embodiments can also be realized, together with their effects, in an electronic ballast according to various embodiments.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for ascertaining a type of a gas discharge lamp using an electronic ballast for operating different types of gas discharge lamps, wherein the different types of gas discharge lamps differ in at least one operating parameter, the method comprising:

a) preheating at least one filament in the gas discharge lamp for a predetermined preheating time;

b) measuring a physical variable which is characteristic of the type of the gas discharge lamp at the end of the preheating time and providing the measurement value of the variable; and c) ascertaining the lamp type on the basis of the measurement value which is provided;

wherein the preheating time is increased by a predetermined time period and b) and c) are repeated if the lamp type in c) cannot be ascertained uniquely.

2. The method as claimed in claim 1, further comprising:

d) storing the ascertained lamp type.

3. The method as claimed in claim 2, further comprising the following steps to be carried out before a):

e1) reading the stored lamp type; and e2) determining the predetermined preheating time as a function of the read lamp type on the basis of an assignment, stored in the electronic ballast, between types of gas discharge lamps which are to be operated using the electronic ballast and associated operating parameters.

4. The method as claimed in claim 1, f1) determining operating parameters which are assigned to the lamp type which has been ascertained on the basis of an assignment, stored in the electronic ballast, between types of gas discharge lamps to be operated using the electronic ballast, and associated operating parameters; and f2) providing the operating parameters determined in step for use for the next preheating.

5. The method as claimed in claim 1, wherein the predetermined preheating time is less than or equal to one second.

6. The method as claimed in claim 1, wherein in b), the value of a variable which is related to the electrical resistance of the preheated filament is measured.

7. The method as claimed in claim 1, wherein the period of the increased preheating time is selected such that the provided measurement value lies in a nearly stationary region.

8. The method as claimed in claim 1, wherein c) comprises:

c1) comparing the provided measurement value with a table of values;

c2) checking whether the provided measurement value falls within a region of the table of values which can be uniquely assigned to a lamp type; and c3) if the provided measurement value can be uniquely assigned to a lamp type, selecting this lamp type as the ascertained lamp type.

9. The method as claimed in claim 8, wherein different tables of values are used as a function of operating parameters used during preheating of the at least one filament.

10. An electronic ballast for operating at least two different types of gas discharge lamps which have at least one different operating parameter, the electronic ballast comprising:

a preheating device for preheating at least one filament of at least one gas discharge lamp which is to be operated using the ballast;

at least one memory device for a) storing an assignment of operating parameters to the at least two different lamp types, wherein one of the operating parameters is a preheating time to be used during preheating of the at least one filament and b) storing a lamp type, or operating parameters assigned to it, from which the next preheating phase is based;

a measurement device for measuring a physical variable which is characteristic of the lamp type of the at least one gas discharge lamp to be operated using the ballast and for providing a measurement value of the physical variable; and a control unit which is adapted to switch on the preheating device for a preheating time which is assigned to the lamp type to be taken from the at least one memory device, to ascertain the current lamp type on the basis of the measurement value provided by the measurement device at the end of the preheating time and to store the ascertained lamp type, or operating parameters assigned to it, in the at least one memory device;

wherein the control unit is furthermore adapted to increase the duration of the preheating time by a predetermined time period if the lamp type cannot be uniquely identified on the basis of the provided measurement value at the end of the preheating time which is assigned to the lamp type which can be taken from the at least one storage device, and the control unit is additionally adapted to ascertain one more time the lamp type on the basis of the measurement value provided at the end of the increased preheating time.

11. The electronic ballast as claimed in claim 10, wherein at least one of the at least one storage device and an additional storage device is configured to store an assignment between measurement values provided by the measurement device and the at least two different lamp types as a function of the operating parameters used in the preheating phase, wherein there exists for each lamp type a core region of measurement values which can be uniquely assigned to the lamp type.

12. The electronic ballast as claimed in claim 10, wherein the preheating device comprises at least one heating transformer with a primary inductor and in each case one secondary inductor for each filament to be heated; and wherein the measurement device is adapted to determine the current flowing through the at least one primary inductor in the preheating phase.

13. The electronic ballast as claimed in claim 12, wherein the measurement device comprises a shunt resistor which is series-connected with the at least one primary inductor of the heating transformer; and wherein the measurement device is adapted to provide a voltage derived from the shunt resistor.

14. The electronic ballast as claimed in claim 10, wherein said storage device is configured to store measurement values provided by the measurement device and at least two different lamp types as a function of the preheating phase operating parameters, wherein a lamp type can be determined by comparing measurements to stored lamp type preheat parameters.

* * * * *

UNITED STATES PATENT AND TRADEMARK OFFICE

CERTIFICATE OF CORRECTION

PATENT NO. : 8,754,652 B2
APPLICATION NO. : 12/769664
DATED : June 17, 2014
INVENTOR(S) : Siegfried Mayer and Christof Schwarzfischer It is certified that error appears in the above-identified patent and that said Letters Patent is hereby corrected as shown below:

Title page, item [73], Assignee, delete "Beschraenkter" and write "beschraenkter" in place thereof.

In the Specification

Column 5, line 56, delete "to t a lamp" and write "to a lamp" in place thereof.

Signed and Sealed this
Third Day of February, 2015

Michelle K. Lee
*Deputy Director of the United States Patent and Trademark Office*